(12) United States Patent
Jose

(10) Patent No.: US 11,004,387 B2
(45) Date of Patent: May 11, 2021

(54) HIGH-EFFICIENCY PIECEWISE LINEAR COLUMN DRIVER WITH ASYNCHRONOUS CONTROL FOR DISPLAYS

(71) Applicant: Samsung Display Co., Ltd., Yongin-si (KR)

(72) Inventor: Anup P. Jose, San Jose, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 49 days.

(21) Appl. No.: 16/283,514

(22) Filed: Feb. 22, 2019

(65) Prior Publication Data
US 2020/0202775 A1 Jun. 25, 2020

Related U.S. Application Data

(60) Provisional application No. 62/784,337, filed on Dec. 21, 2018.

(51) Int. Cl.
G09G 3/36 (2006.01)
G09G 3/3233 (2016.01)
H03K 19/21 (2006.01)

(52) U.S. Cl.
CPC ......... *G09G 3/3233* (2013.01); *G09G 3/3607* (2013.01); *H03K 19/21* (2013.01)

(58) Field of Classification Search
CPC .......... G09G 3/32; G09G 3/3233; G09G 3/36; G09G 3/3607; H03K 19/21
See application file for complete search history.

(56) References Cited

U.S. PATENT DOCUMENTS 7,514,989 B1    4/2009  Somverville et al.
8,212,703 B2    7/2012  Katsis et al.
(Continued)

FOREIGN PATENT DOCUMENTS

KR    10-1830302 B1    3/2018

OTHER PUBLICATIONS

Jin-Yong Jeon, et al., "A Direct-Type Fast Feedback Current Driver for Medium-to Large-Size AMOLED Displays", ISSCC, Session 8, Medical Displays 8.7, IEEE International Solid-State Circuits Conference, Feb. 5, 2008, pp. 174-175 and 604, Kaist, Dejoen, Korea.

(Continued)

*Primary Examiner* — Alexander Eisen
*Assistant Examiner* — Cory A Almeida
(74) *Attorney, Agent, or Firm* — Lewis Roca Rothgerber Christie LLP

(57) ABSTRACT

A device includes a segmented pull-up current source circuit including a first plurality of transistors, a segmented pull-down current source circuit including a second plurality of transistors, a comparator circuit configured to compare an output voltage level at the output of the device with a target voltage level and generate a comparator output at one of two output terminals of the comparator circuit, wherein the segmented pull-up current source circuit and the segmented pull-down current source circuit are connected to the two output terminals of the comparator circuit via one or more multiplexers, the first plurality of AND gate circuits and a second plurality of AND gate circuits; and a logic circuit connected to at least one output terminal of the comparator circuit and configured to control an operation of the segmented pull-up current source circuit and the segmented pull-down current source circuit based on the comparator output.

20 Claims, 9 Drawing Sheets

(56) References Cited

U.S. PATENT DOCUMENTS

| | | | |
|---|---|---|---|
| 9,985,665 B1 | 5/2018 | Salib | |
| 2003/0058732 A1 | 3/2003 | Nam | |
| 2003/0151599 A1* | 8/2003 | Bone | G09G 3/3648 |
| | | | 345/204 |
| 2004/0095306 A1* | 5/2004 | Fujiyoshi | G09G 3/3688 |
| | | | 345/94 |
| 2007/0010961 A1 | 1/2007 | Nguyen et al. | |
| 2007/0147573 A1* | 6/2007 | Tobita | G11C 19/28 |
| | | | 377/64 |
| 2017/0004799 A1 | 1/2017 | Park et al. | |
| 2018/0122291 A1 | 5/2018 | Kim et al. | |

OTHER PUBLICATIONS

Davide Marano, et al., "A Novel Low-Power High-Speed Rail-to-Rail Class-B Buffer Amplifier for LCD Output Drivers", DIEES, Department of Electrical, Electronic and Systems Engineering, IEEE, 2010, pp. 2816-2819, University of Catania, Catania, Italy.
Jun-Suk Bang, et al., "A Hybrid AMOLED Driver IC for Real-Time TFT Nonuniformity Compensation", IEEE Journal of Solid-State Circuits , pp. 966-978, vol. 51, No. 4, Apr. 2016.
Extended European Search Report for corresponding European Patent Application No. 19206683.5, dated Mar. 13, 2020, 15 pages.

\* cited by examiner

FIG. 3 -RELATED ART-

HIGH-EFFICIENCY PIECEWISE LINEAR COLUMN DRIVER WITH ASYNCHRONOUS CONTROL FOR DISPLAYS

CROSS-REFERENCE TO RELATED APPLICATION(S)

The present application claims priority to and the benefit of U.S. Provisional Patent Application Ser. No. 62/784,337, filed Dec. 21, 2018 and entitled "HIGH-EFFICIENCY PIECE-WISE LINEAR COLUMN-DRIVERS WITH ASYNCHRONOUS CONTROL FOR DISPLAYS," the entire content of which is hereby expressly incorporated by reference.

FIELD

One or more aspects of embodiments according to the present invention relate to display drivers, for example, a system and a method for a high-efficiency piecewise linear column driver with asynchronous control for displays.

BACKGROUND

Display devices such as organic light emitting diode (OLED) displays and liquid crystal displays (LCD) include a plurality of pixels at crossing regions defined by a plurality of scan lines extending in a row direction and a plurality of data lines extending in a column direction. A scan driver sequentially applies scan signals to the scan lines and a data driver supplies data signals to a plurality of data lines to write data to control the pixels to display images.

The data driver may include one or more digital-to-analog converters (DACs) to convert digital data to analog signals and one or more amplifier stages to amplify the analog data signals and to supply the amplified analog signals to the data lines.

The above information in the Background section is only for enhancement of understanding of the background of the technology and therefore it should not be construed as admission of existence or relevancy of the prior art.

SUMMARY

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

Aspects of example embodiments of the present disclosure relate to a system and a method for a high-efficiency piecewise linear column driver with asynchronous control for displays.

In some embodiments, a device includes a segmented pull-up current source circuit configured to supply a pull-up current to a load connected to an output of the device, wherein the segmented pull-up current source circuit including a first plurality of transistors including m-sets of transistors, wherein each set of transistors of the m-sets of transistors of the first plurality of transistors includes a p-type metal-oxide-semiconductor field-effect transistor (MOSFET) and an n-type MOSFET connected in series with each other; a segmented pull-down current source circuit configured to supply a pull-down current to the load connected to the output of the device, wherein the segmented pull-down current source circuit including a second plurality of transistors including m-sets of transistors, wherein each set of transistors of the m-sets of transistors of the second plurality of transistors includes two n-type MOSFETs connected in series with each other, wherein the segmented pull-up current source circuit and the segmented pull-down current source circuit are connected to each other via a first plurality of AND gate circuits and a second plurality of AND gate circuits; a comparator circuit configured to compare an output voltage level at the output of the device with a target voltage level and generate a comparator output at one of two output terminals of the comparator circuit, wherein the segmented pull-up current source circuit and the segmented pull-down current source circuit are connected to the two output terminals of the comparator circuit via one or more multiplexers, the first plurality of AND gate circuits and a second plurality of AND gate circuits; and a logic circuit connected to at least one output terminal of the comparator circuit and configured to control an operation of the segmented pull-up current source circuit and the segmented pull-down current source circuit based on the comparator output.

In some embodiments, the device is a column driver for an organic light emitting diode (OLED) display and wherein the load connected to the output of the device is an OLED. In some embodiments, "m" and "n" are positive integers. In some embodiments, in each set of transistors of the m-sets of transistors of the first plurality of transistors, a source terminal of the p-type MOSFET is connected to VDD, a drain terminal of the p-type MOSFET is connected to a drain terminal of the n-type MOSFET, and a gate terminal of the p-type MOSFET is connected to a bias voltage Vbiasp. In some embodiments, in the m-sets of transistors of the first plurality of transistors, source terminals of the n-type MOSFETs are connected with each other and to the output of the device, and gate terminals of the n-type MOSFETs are connected to output terminals of the corresponding ones of the first plurality of AND gate circuits including "m" individual AND gate circuits.

In some embodiments, in the m-sets of transistors of the second plurality of transistors, drain terminals of first n-type MOSFETs are connected with each other and to the output of the device, and wherein gate terminals of the first n-type MOSFETs are connected to output terminals of the corresponding ones of the second plurality of AND gate circuits including "m" individual AND gate circuits. In some embodiments, in each set of transistors of the m-sets of transistors of the second plurality of transistors, a source terminal of the first n-type MOSFET is connected to a drain terminal of a second n-type MOSFET, a source terminal of the second n-type MOSFET is connected to ground and a gate terminal of the second n-type MOSFET is connected to a bias voltage Vbiasn.

In some embodiments, the comparator circuit is an operational amplifier (op-amp). In some embodiments, the logic circuit is a n-bit shift register includes an "n" individual shift registers configured to turn on or turn of one or more transistor sets from the first plurality of transistors or the second plurality of transistors based on the comparator output. In some embodiments, a first output terminal of each of the "n" individual shift registers is connected to an input terminal of the next shift register of the "n" individual shift registers via a multiplexer of a plurality of (n−1) multiplexers. In some embodiments, a digital logic is used to determine a magnitude of difference between a new and an old pixel gray levels. In some embodiments, the logic circuit is connected to at least one output terminal of the comparator circuit via a pulse generator configured to generate a pulse at every transition of the comparator output, wherein the pulse generator is an exclusive-OR gate circuit.

In some embodiments, a device includes a segmented pull-up current source circuit configured to supply a pull-up current to a load connected to an output of the device; a segmented pull-down current source circuit configured to supply a pull-down current to the load connected to the output of the device; a comparator circuit configured to compare an output voltage level at the output of the device with a target voltage level and generate a comparator output at one of two output terminals of the comparator circuit; and a logic circuit connected to at least one output terminal of the comparator circuit and configured to control an operation of the segmented pull-up current source circuit and the segmented pull-down current source circuit based on the comparator output.

In some embodiments, the segmented pull-up current source circuit including a first plurality of transistors including m-sets of transistors, wherein each set of transistors of the m-sets of transistors of the first plurality of transistors includes a p-type metal-oxide-semiconductor field-effect transistor (MOSFET) and an n-type MOSFET connected in series with each other; the segmented pull-down current source circuit including a second plurality of transistors including m-sets of transistors, wherein each set of transistors of the m-sets of transistors of the second plurality of transistors includes two n-type MOSFETs connected in series with each other, wherein the segmented pull-up current source circuit and the segmented pull-down current source circuit are connected to each other via a first plurality of AND gate circuits and a second plurality of AND gate circuits; and the segmented pull-up current source circuit and the segmented pull-down current source circuit are connected to the two output terminals of the comparator circuit via one or more multiplexers, the first plurality of AND gate circuits and a second plurality of AND gate circuits.

In some embodiments, the device is a column driver for an organic light emitting diode (OLED) display, wherein the load connected to the output of the device is an OLED, and wherein "m" and "n" are positive integers. In some embodiments, in each set of transistors of the m-sets of transistors of the first plurality of transistors, a source terminal of the p-type MOSFET is connected to VDD, a drain terminal of the p-type MOSFET is connected to a drain terminal of the n-type MOSFET, and a gate terminal of the p-type MOSFET is connected to a bias voltage Vbiasp. In some embodiments, in the m-sets of transistors of the first plurality of transistors, source terminals of the n-type MOSFETs are connected with each other and to the output of the device, and gate terminals of the n-type MOSFETs are connected to output terminals of the corresponding ones of the first plurality of AND gate circuits including "m" individual AND gate circuits.

In some embodiments, in the m-sets of transistors of the second plurality of transistors, drain terminals of first n-type MOSFETs are connected with each other and to the output of the device, wherein gate terminals of the first n-type MOSFETs are connected to output terminals of the corresponding ones of the second plurality of AND gate circuits including "m" individual AND gate circuits, and wherein in each set of transistors of the m-sets of transistors of the second plurality of transistors, a source terminal of the first n-type MOSFET is connected to a drain terminal of a second n-type MOSFET, a source terminal of the second n-type MOSFET is connected to ground and a gate terminal of the second n-type MOSFET is connected to a bias voltage Vbiasn.

In some embodiments, the logic circuit is a n-bit shift register includes an "n" individual shift registers configured to turn on or turn of one or more transistor sets from the first plurality of transistors or the second plurality of transistors based on the comparator output, wherein a first output terminal of each of the "n" individual shift registers is connected to an input terminal of the next shift register of the "n" individual shift registers via a multiplexer of a plurality of (n−1) multiplexers, and wherein a digital logic is used to determine a magnitude of difference between a new and an old pixel gray levels.

In some embodiments, a method of driving a display driver includes a segmented pull-up current source circuit configured to supply a pull-up current to a load connected to an output of the display driver, wherein the segmented pull-up current source circuit including a first plurality of transistors including m-sets of transistors, wherein each set of transistors of the m-sets of transistors of the first plurality of transistors includes a p-type metal-oxide-semiconductor field-effect transistor (MOSFET) and an n-type MOSFET connected in series with each other; a segmented pull-down current source circuit configured to supply a pull-down current to the load connected to the output of the display driver, wherein the segmented pull-down current source circuit including a second plurality of transistors including m-sets of transistors, wherein each set of transistors of the m-sets of transistors of the second plurality of transistors includes two n-type MOSFETs connected in series with each other, wherein the segmented pull-up current source circuit and the segmented pull-down current source circuit are connected to each other via a first plurality of AND gate circuits and a second plurality of AND gate circuits; a comparator circuit configured to compare an output voltage level at the output of the display driver with a target voltage level and generate a comparator output at one of two output terminals of the comparator circuit, wherein the segmented pull-up current source circuit and the segmented pull-down current source circuit are connected to the two output terminals of the comparator circuit via one or more multiplexers, the first plurality of AND gate circuits and a second plurality of AND gate circuits; and a logic circuit connected to at least one output terminal of the comparator circuit and configured to control an operation of the segmented pull-up current source circuit and the segmented pull-down current source circuit based on the comparator output; the method includes turning on the first plurality of transistors including m-sets of transistors based on receiving a start pulse from a pulse generator at an input terminal of the logic circuit; comparing at the comparator the output voltage level at the output of the display driver with the target voltage level to generate the comparator output; and turning on or turning off one or more of the first plurality of transistors or the second plurality of transistors based on the comparator output.

BRIEF DESCRIPTION OF THE DRAWINGS

These and other features of some example embodiments of the present invention will be appreciated and understood with reference to the specification, claims, and appended drawings, wherein:

DETAILED DESCRIPTION

The detailed description set forth below in connection with the appended drawings is intended as a description of some example embodiments of a system and a method for a high-efficiency piecewise linear column driver with asynchronous control for displays provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

Figure 1:
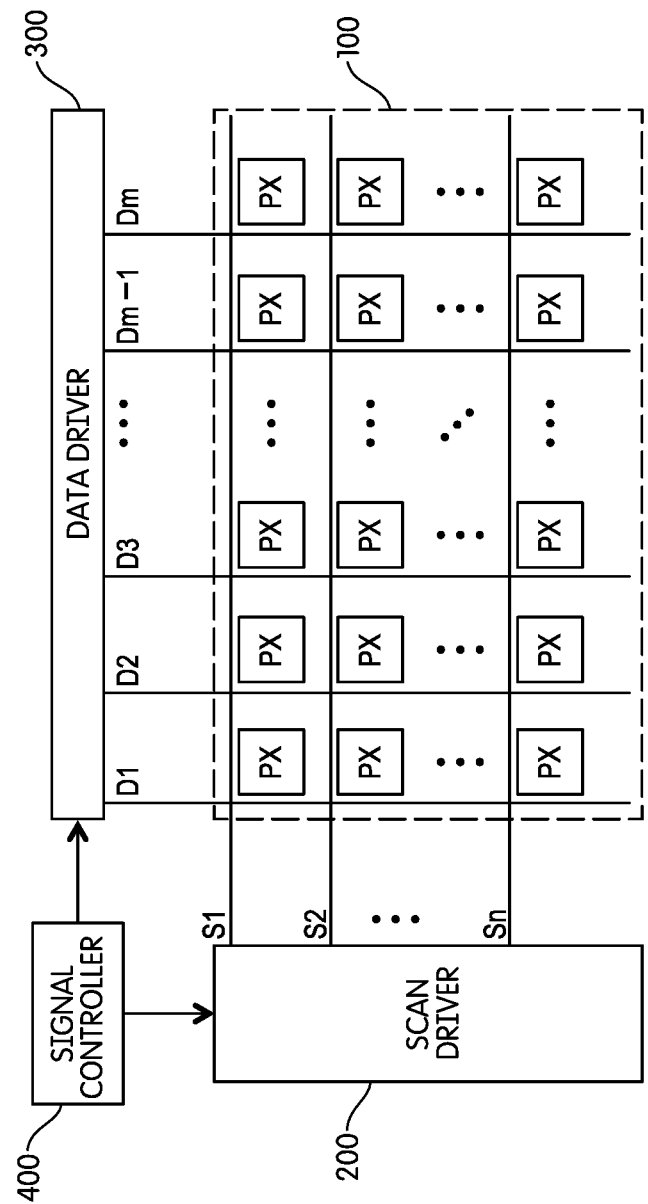
FIG. 1 is a block diagram of a display device according to some embodiments of the present disclosure.

FIG. 1 is a block diagram of a display device according to some embodiments of the present disclosure. Referring to FIG. 1, the display device includes a display unit 100, a scan driver 200 and a data driver 300 connected thereto, and a signal controller 400 for controlling the scan driver 200 and the data driver 300.

In an exemplary embodiment, the display unit 100 includes a plurality of display signal lines (S1-Sn, D1-Dm) and a plurality of pixels (PX) connected thereto and substantially arranged in a matrix form.

The display signal lines (S1-Sn, D1-Dm) include a plurality of scan lines (S1-Sn) for transmitting scan signals (also called gate signals) and data lines (D1-Dm) for transmitting data signals. The scan lines (S1-Sn) extend along a row direction and are substantially parallel with each other, and the data lines (D1-Dm) extend in a column direction and are substantially parallel with each other. The pixels PX are located at crossing regions of the scan lines (S1-Sn) and the data lines (D1-Dm).

The scan driver 200 is connected to the scan lines (S1-Sn) and applies a scan signal formed by combination of a gate-on voltage and a gate-off voltage to the scan lines (S1-Sn). The gate-on voltage represents a voltage that is applied to a gate of a transistor to turn on the transistor, and the gate-off voltage represents a voltage that is applied to the gate of the transistor to turn it off.

The data driver 300 is connected to the data lines (D1-Dm), generates a data signal for indicating a grayscale value of the pixel (PX), and applies it to the data lines (D1-Dm).

The signal controller 400 controls the scan driver 200 and the data driver 300. For example, the signal controller 400 supplies data (e.g., digital data) to the data driver 300 and may also supply synchronization signals (VSYNC and HSYNC) to the scan driver 200 and/or the data driver 300 to synchronize the writing of the data to the pixels PX with the scan signals to set the pixels PX into a writable state. The data supplied to the data driver 300 may be digital data (e.g., where the data to be supplied to each data line is encoded as an 8-bit value) representing the luminance or gray level of the light to be emitted by a pixel.

Each pixel (PX) may include a transistor that includes a gate electrode connected to the scan line and source and drain electrodes connected to a corresponding one of the data lines (e.g., the data line corresponding to the column that the pixel is in). The transistor transmits the data signal provided by the data line in response to the gate-on voltage provided by the scan line, and the data signal controls the gray level of the light emitted by the pixel. When the display device is a liquid crystal display (LCD), the light emitting region may include a capacitor for storing the data signal, and a liquid crystal layer may control a level of brightness of light emitted according to the data signal stored in the capacitor. When the display device is an organic light emitting device (e.g., an active organic light emitting device), the light emitting region may include a capacitor for storing the data signal, a driving transistor for transmitting a current according to the data signal stored in the capacitor, and an organic light emitting diode (OLED) for emitting light having a gray level in accordance with the current provided by the driving transistor.

The drivers 200, 300, and 400 may be respectively mounted on the display unit 100 as at least one integrated circuit chip, may be mounted on a flexible printed circuit film (not shown) and be attached to the display unit 100 as a tape carrier package (TCP), or may be mounted on an additional printed circuit board (not shown). Alternatively, the drivers 200, 300, and 400 may be integrated with the display unit 100 together with the signal lines (S1-Sn, D1-Dm) and the transistors. Also, the drivers 200, 300, and 400 may be integrated into a single chip, and in this case, at least one of them or at least one circuit element forming them may be provided outside the single chip.

Figure 2:
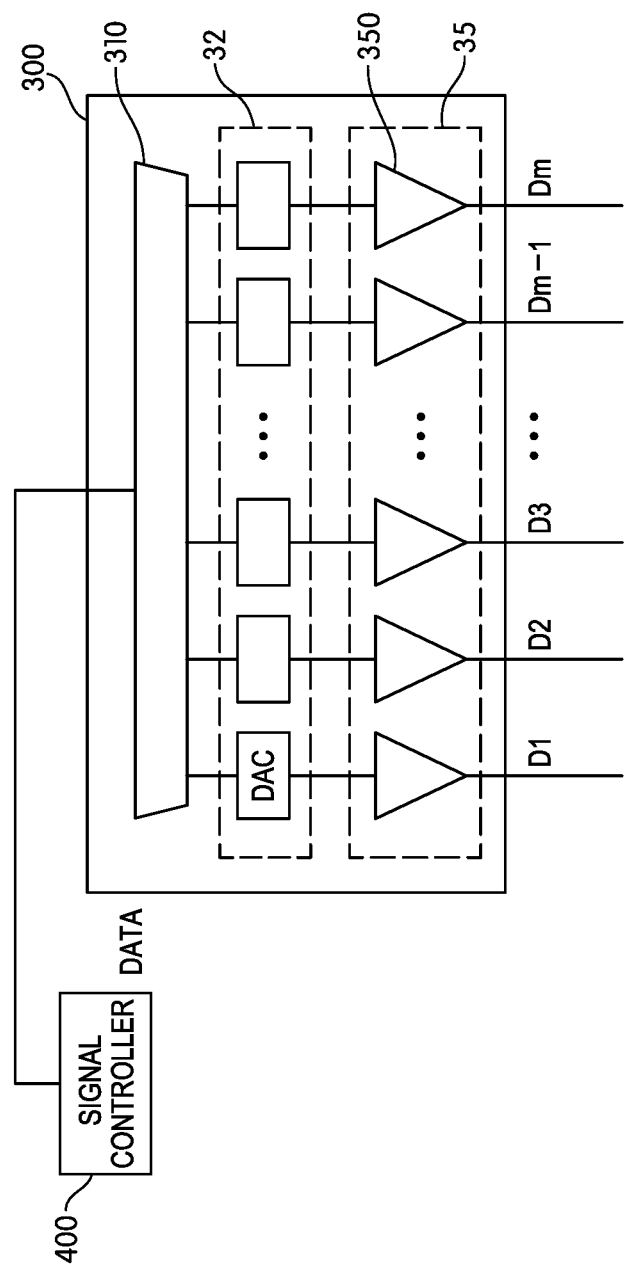
FIG. 2 is a block diagram of a data driver according to some embodiments of the present disclosure.

FIG. 2 is a block diagram of a data driver 300 according to some embodiments of the present disclosure. Referring to FIG. 2, the signal controller 400 is coupled to the data driver 300 to supply digital data signals Data to a digital demultiplexer 310. The demultiplexer 310 demultiplexes the digital data to generate m separate digital data signals, one for each column of the display unit 100. The m digital data signals are supplied to digital-to-analog converters 32, which are configured to output analog data signals to an amplifier or column driver stage 35, which includes amplifiers or column drivers 350. The amplifiers or column drivers 350 amplify the analog signals to the operating voltage and current specifications of the pixels and output the amplified signals to the data lines D1-Dm.

Either current or voltage driving schemes may be employed for amplitude modulation (e.g., pulse amplitude modulation (PAM)) in OLED displays. Current driving methods may improve the luminance uniformity at the OLED display panels and may provide compensation of thin film transistor (TFT) characteristics at pixels. However, with the current driving methods, when the parasitic capacitance of a data line is increased, the driving speed is substantially degraded. In some example embodiments, the current-feedback driving methods accurately transfer data currents to pixels and compare the data with pixel currents. However, the feedback operation, where the pixel current is detected, may invoke a time delay to charge and discharge the parasitic capacitance of the feedback path with the pixel or data current.

Figure 3:
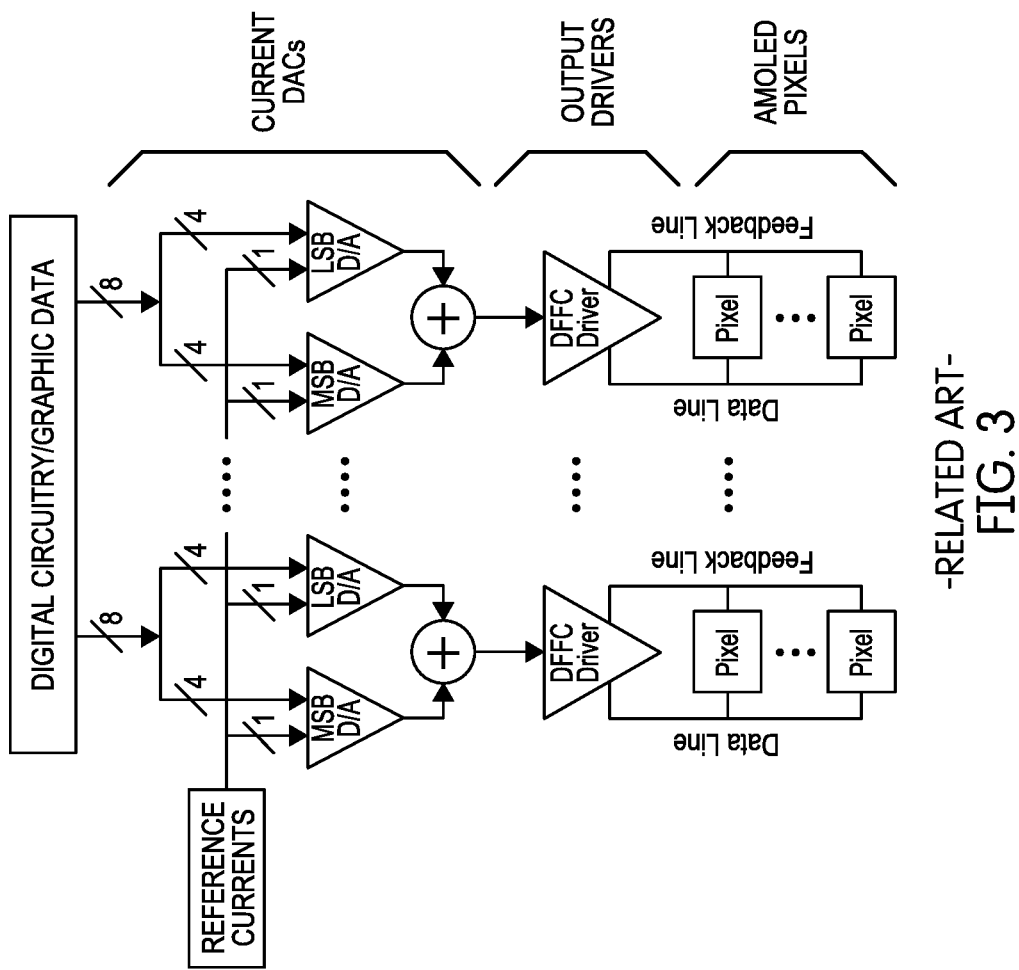
FIG. 3 illustrates a related art display column driver architecture.
Figure 4:
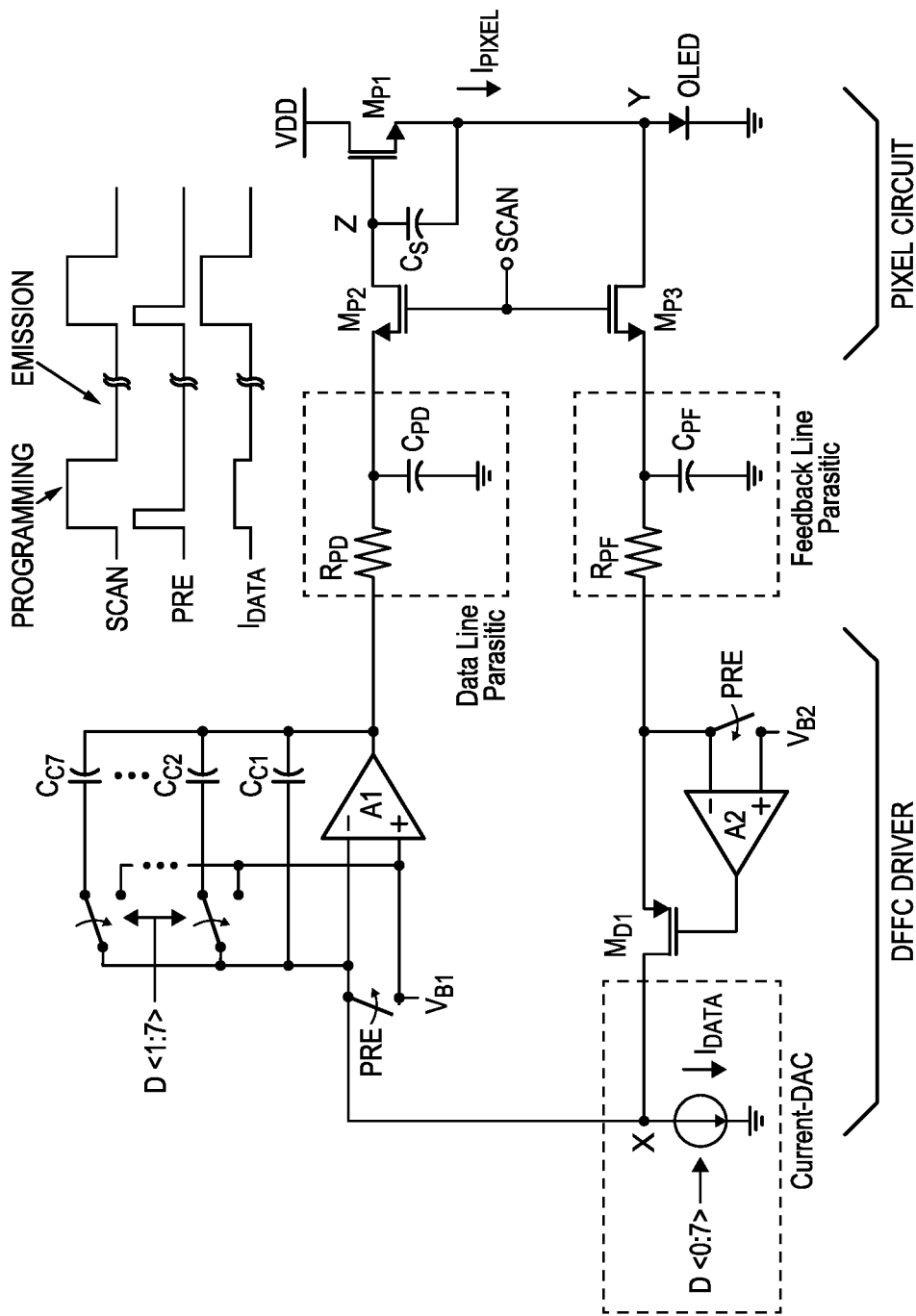
FIG. 4 illustrates the a direct-type fast feedback current (DFFC) driver, the pixel circuit, and the control signals of the related art display column driver architecture of FIG. 3.

FIGS. 3 and 4 illustrate a DFFC driver of a related art that offers fast settling time with accuracy by comparing the data with the pixel current directly.

FIG. 3 illustrates a display column driver architecture and OLED pixels of the current driving method of a related art. The digital to analog converter (DAC) in FIG. 3 may be DAC 32 of FIG. 2. The DFFC driver of FIG. 3 forms a feedback loop with the pixel circuits through a data line and feedback line and transfers the output current of the DAC to the pixels.

FIG. 4 illustrates the DFFC driver, the pixel circuit, and the control signals of the related art display column driver architecture of FIG. 3. In some example embodiments, during the programming period, the DFFC driver and pixel circuit are composed of a feedback loop with OLED off. The data current $I_{DATA}$ is compared with $I_{PIXEL}$ at node X and the error between the two currents is integrated and compensated considering the overall feedback loop. The driving speed may be improved by reducing the effect of parasitic capacitance. The effect of parasitic capacitance $C_{PD}$ in the data line is reduced because amplifier A1 has low output impedance, and thus the error signal of the differential input may change the voltage of $C_{PD}$ quickly. The effect of $C_{PF}$ in the feedback line is suppressed because its voltage is held constant by the sub-loop of A2 and $M_{D1}$. The feedback loop is stabilized by the dominant-pole at node X. In some example embodiments, the characteristic of the loop varies with $I_{DATA}$, because the conductance of $M_{P1}$ changes depending on the current. Therefore, the compensation capacitor $C_C$ may also be changed adaptively.

Although the DFFC of FIG. 4 offers fast settling time with good accuracy, area overhead may be an issue with respect to the circuits of FIGS. 3-4, as different output current ranges may require different compensation capacitor $C_C$. Also, power overhead may be an issue with respect to the circuits of FIGS. 3-4, as the op-amps A1 and A2 in FIG. 4 may consume static current in addition to the current used for charging output (display column).

Typical voltage-mode drivers for displays (e.g., OLED displays) use a Class-B or Class-AB architecture. In some embodiments of the voltage-mode drivers for displays, a single amplifier draws a relatively low (e.g., approximately few uA) static current.

Figure 5:
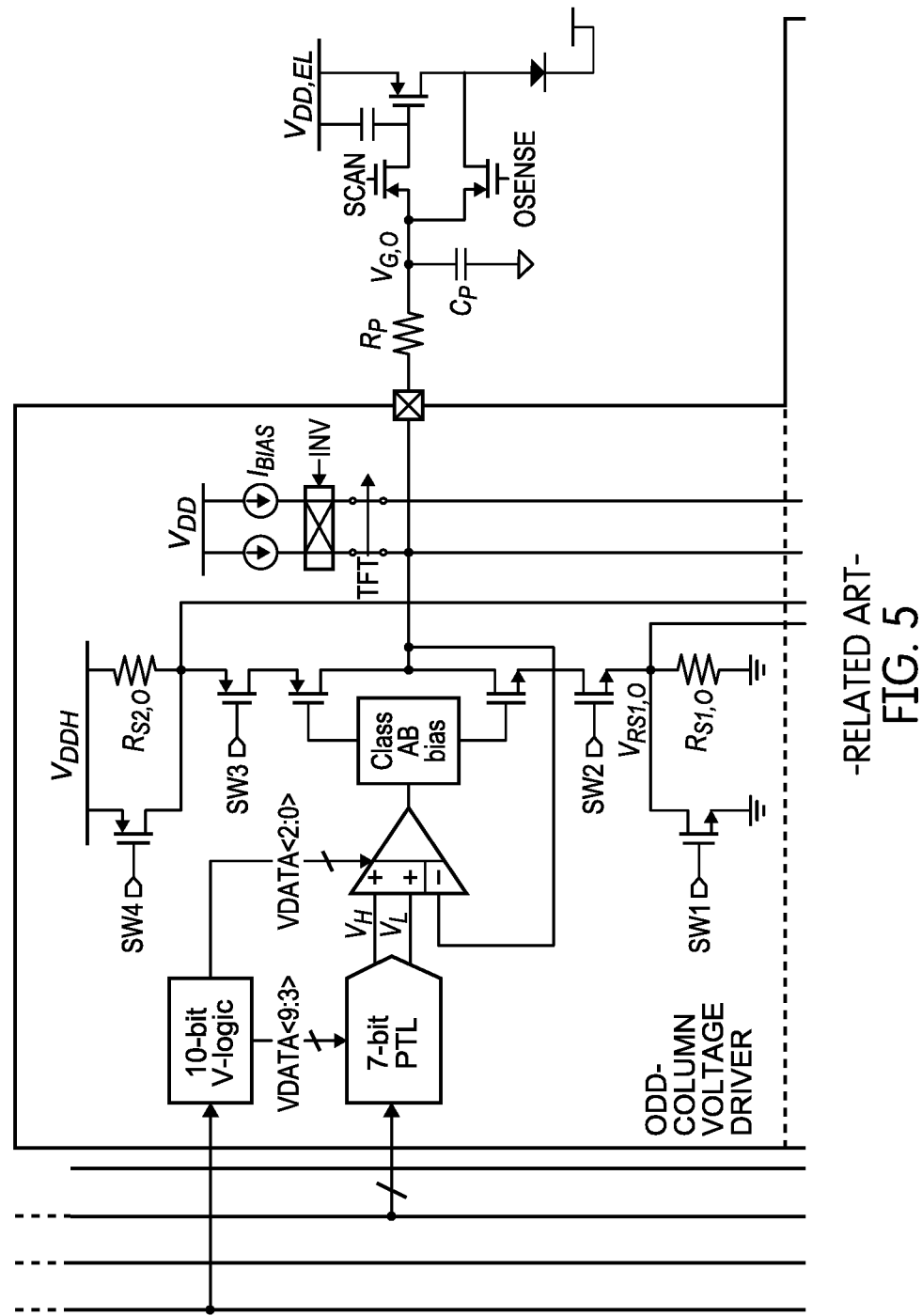
FIG. 5 illustrates a block diagram (a portion of) of a related art odd column voltage driver for OLED displays.

FIG. 5 illustrates a block diagram (a portion of) of a related art odd column voltage driver for OLED displays. The voltage driver of FIG. 5 includes a 10 bit VDAC and a class AB buffer amplifier with two current-sensing resistors $R_{S1}$ and $R_{S2}$. $R_{S1}$ may sense the pulling-current and $R_{S2}$ may sense the pushing-current. In some embodiments, one or more bias current sources in the voltage driver of FIG. 5 may source or sink constant currents (IBIAS) depending on which current is to be sensed so as to ensure the legroom of noise current swing.

Figure 6:
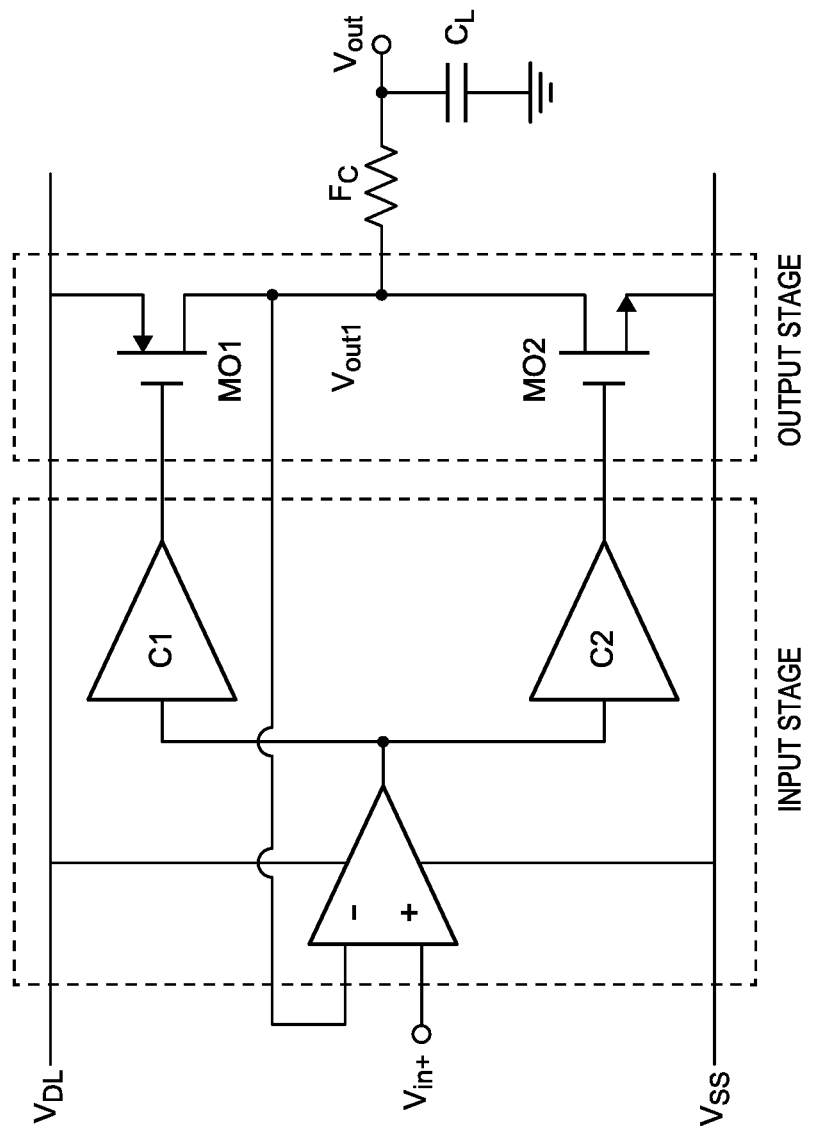
FIG. 6 illustrates a block diagram of a related art class-B buffer.

FIG. 6 illustrates a block diagram of a related art class-B buffer, which includes an input rail-to-rail differential amplifier, embodying the two current comparators C1 and C2, the output complementary devices MO1 and MO2 and a series resistor RC providing phase compensation. The class-B buffer amplifier of FIG. 6 provides an improvement in power efficiency, as both current comparators are freely incorporated into the input differential stage.

Although, voltage mode drivers for the displays (e.g., OLED displays) draw a relatively low static current (e.g., approximately few uA), in some embodiments, static current consumption may be significant (e.g., adds up over approximately 2000 column drivers) in a relatively large display. Moreover, in some embodiments, during settling (e.g., charging or discharging the display column), the voltage-mode drivers for displays can cause large current spikes and there is no control mechanism over current spike during settling (e.g., approximately 2000 column drivers switching simultaneously).

Therefore, there is a need for a display driver with high power efficiency and reduced dynamic current spike. The example embodiments of the present disclosure provide a display driver with both high power efficiency and programmable dynamic current spike. For example, in the proposed display driver, energy wasted due to static current may be completely eliminated as all the current drawn by the display driver goes towards charging or discharging the column line. In the example display driver, dynamic current spike may be controlled by using a bank of current sources. Unlike a class-B or class-AB amplifier, this limits the peak current drawn from supply. For example, the display driver speed may be traded off for reduced current spike, as slower the speed of the display driver, greater the horizontal line time and therefore greater the time available for the line voltage to converge to the final value. The dynamic current spike may also be controlled in the display driver by reducing initial charging current if previous gray level (i.e., column line voltage) is close to the present gray level. Moreover, in order to avoid additional clock distribution networks, the example display driver may use asynchronous signaling between various stages, as the integrated chips (IC) in the display drivers may be fairly large and additional clock distribution power may be significant in driver ICs.

Figure 7:
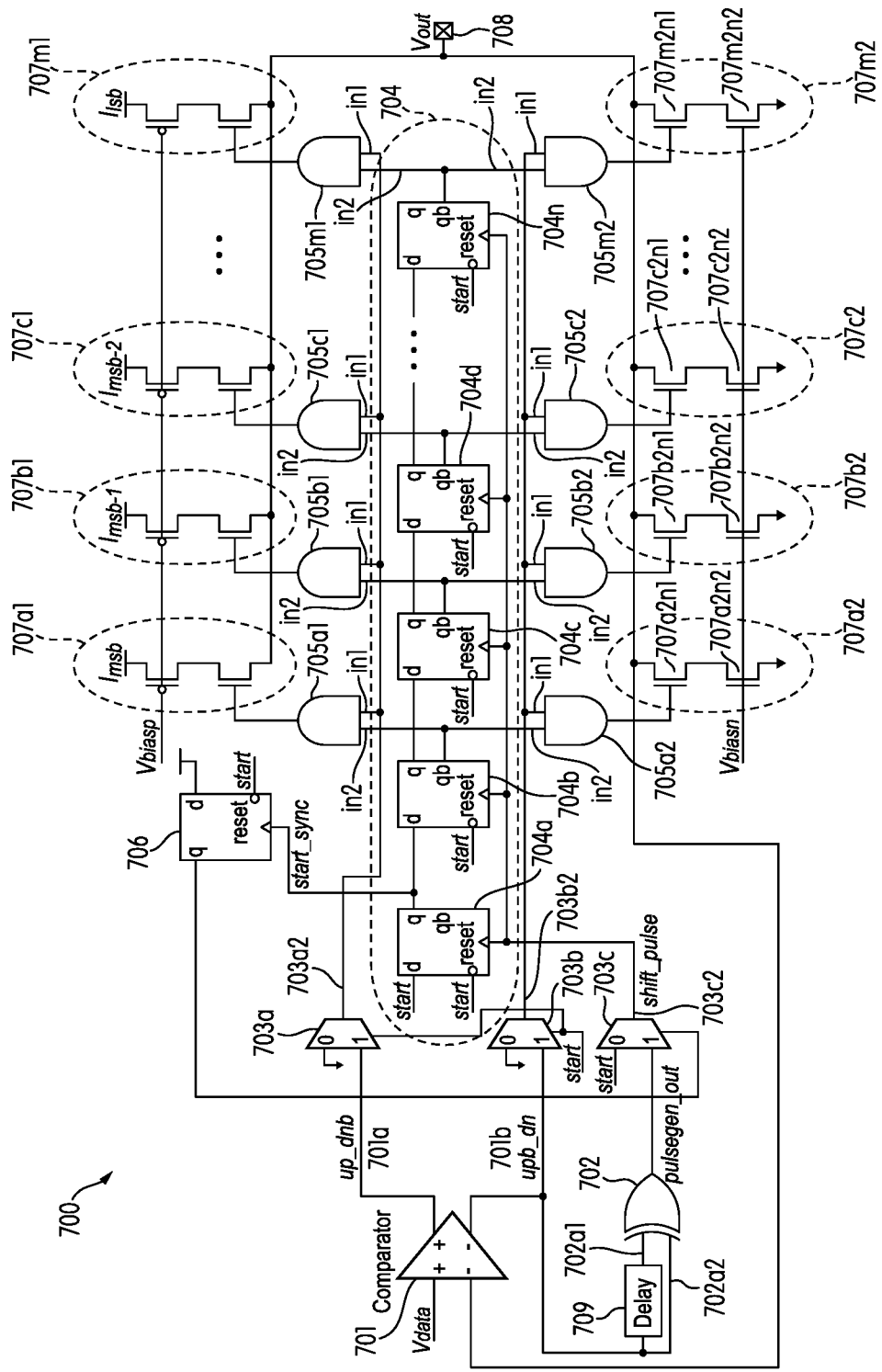
FIG. 7 illustrates an example embodiment of a display driver circuit according to some embodiments of the present disclosure.

FIG. 7 illustrates an example embodiment of a display driver circuit 700. In some example embodiments, the display driver 700 may be a column driver (e.g., column driver 350). The display driver 700 of FIG. 7 includes a comparator 701, a pulse generator 702, a plurality of multiplexers 703a, 703b, and 703c, and an n-bit shift register 704 including "n" individual shift registers 704a, 704b, 704c, 704d, . . . , 704n. The comparator 701 may be an operational amplifier (op-amp) and the pulse generator 702 may be an exclusive-OR gate circuit. The display driver 700 of FIG. 7 also includes a first plurality of AND gate circuits including "m" individual AND gate circuits 705a1, 705b1, 705c1, . . . , 705m1, and a second plurality of AND gates circuits including "m" individual AND gates circuits 705a2, 705b2, 705c2, . . . , 705m2. In the example embodiment of FIG. 7, "n" and "m" may be positive integers and "n" is different than "m".

The display driver 700 of FIG. 7 also includes a first plurality of transistors (e.g., pull-up transistors) including m-sets of transistors 707a1, 707b1, 707c1, 707m1. The first plurality of transistors 707a1, 707b1, 707c1, . . . , 707m1 may be called a segmented pull-up current source. Each of the transistor sets 707a1, 707b1, 707c1, . . . , 707m1 may be called pull-up transistor sets or pull-up current legs. The first plurality of transistors 707a1, 707b1, 707c1, . . . , 707m1 may be configured to supply a pull-up current to a load (e.g., OLED) connected to an output 708 of the display driver 700. Each set of transistors of the m-sets of transistors 707a1, 707b1, 707c1, . . . , 707m1, includes a p-type metal-oxide-semiconductor field-effect transistor (MOSFET) and an n-type MOSFET connected in series with each other. For example, in each of the transistor sets 707a1, 707b1, 707c1, . . . , 707m1, the source terminal of the p-type MOSFET is connected to VDD and the gate terminal of the p-type MOSFET is connected to a bias voltage Vbiasp. The p-type MOSFET in each of the transistor sets 707a1, 707b1, 707c1, ..., 707m1 may act as a current source.

In each of the transistor sets 707a1, 707b1, 707c1, ..., 707m1, the drain terminal of the p-type MOSFET is connected to the drain terminal of the n-type MOSFET. Also, the source terminals of the n-type MOSFETs in the 707a1, 707b1, 707c1, ..., 707m1, are connected with each other and to the output 708 of the display driver 700. As such, each of the transistor sets 707a1, 707b1, 707c1, ..., 707m1 may be called pull-up transistor sets or pull-up current legs. The n-type MOSFET in each of the 707a1, 707b1, 707c1, ..., 707m1 is simply a switch that is used to enable or disable that particular current leg (e.g., 707a1, 707b1, 707c1, ..., 707m1). The gate terminal of each of the n-type MOSFETs in each of the 707a1, 707b1, 707c1, ..., 707m1, is connected to the output terminal of the corresponding ones of the first plurality of AND gate circuits 705a1, 705b1, 705c1, 705d1, 705e1, ..., 705m1. For example, the gate terminal of the n-type MOSFET of the transistor set 707a1 is connected to the output terminal of the AND gate circuit 705a1, the gate terminal of the n-type MOSFET of the transistor set 707b1 is connected to the output terminal of the AND gate circuit 705b1, the gate terminal of the n-type MOSFET of the transistor set 707c1 is connected to the output terminal of the AND gate circuit 705c1, or the like.

The display driver 700 further includes a second plurality of transistors (e.g., pull-down transistors) including m-sets of transistors 707a2, 707b2, 707c2, ..., 707m2. The second plurality of transistors 707a2, 707b2, 707c2, ..., 707m2 may be called a segmented pull-down current source. Each of the transistor sets 707a2, 707b2, 707c2, ..., 707m2 may be called pull-down transistor sets or pull-down current legs. The second plurality of transistors 707a2, 707b2, 707c2, ..., 707m2 may be configured to supply a pull-down current to a load (e.g., OLED) connected to the output 708 of the display driver 700. Each set of transistors of the m-sets of transistors 707a2, 707b2, 707c2, ..., 707m2, includes two n-type MOSFETs connected in series with each other. For example, the drain terminals of the first n-type MOSFETs (e.g., 707a2n1, 707b2n1, 707c2n1, ..., 707m2n1) of 707a2, 707b2, 707c2, ..., 707m2 are connected with each other and to the output 708 of the display driver 700.

The gate terminal of each of the first n-type MOSFET (e.g., 707a2n1, 707b2n1, 707c2n1, ..., 707m2n1) in each of 707a2, 707b2, 707c2, ..., 707m2, are connected to the output terminal of the corresponding ones of the second plurality of AND gate circuits 705a2, 705b2, 705c2, ..., 705m2. For example, the gate terminal of the first n-type MOSFET 707a2n1 of the transistor set 707a2 is connected to the output terminal of the AND gate circuit 705a2, the gate terminal of the first n-type MOSFET 707b2n1 of the transistor set 707b2 is connected to the output terminal of the AND gate circuit 705b2, the gate terminal of the first n-type MOSFET 707c2n1 of the transistor set 707c2 is connected to the output terminal of the AND gate circuit 705c2, or the like.

In each of the transistor sets 707a2, 707b2, 707c2, ..., 707m2, the source terminal of the first n-type MOSFET (e.g., 707a2n1, 707b2n1, 707c2n1, ..., 707m2n1) is connected to the drain terminal of the second n-type MOSFET (e.g., 707a2n2, 707b2n2, 707c2n2, ..., 707m2n2) in that transistor set. For example, in the transistor set 707a2, the source terminal of the first n-type MOSFET 707a2n1 is connected to the drain terminal of the second n-type MOSFET 707a2n2. In each of the transistor sets 707a2, 707b2, 707c2, ..., 707m2, the source terminal of the second n-type MOSFET (e.g., 707a2n2, 707b2n2, 707c2n2, ..., 707m2n2) is connected to the ground and the gate terminal of the second n-type MOSFET (e.g., 707a2n2, 707b2n2, 707c2n2, ..., 707m2n2) is connected to a bias voltage Vbiasn. The transistors 707a2n2, 707b2n2, 707c2n2, ..., 707m2n2 (gate connected to Vbiasn) are the current sources and each of the transistors 707a2n1, 707b2n1, 707c2n1, ..., 707m2n1 is simply a switch that is used to enable or disable that particular current-source leg (e.g., 707a2, 707b2, 707c2, ..., 707m2).

The comparator 701 compares the voltage Vout at the output 708 of the display driver 700 with a reference voltage Vdata. Vdata may be a voltage that the display driver 700 prefers (or desires) the output voltage Vout to be at. If the compared voltage at the comparator 701 is a negative voltage or if the comparator 701 determines that Vout is less than Vdata, the first output 701a of the comparator 701, which is connected to the first input of the 2-to-1 multiplexer 703a, is turned on. The second input of the 2-to-1 multiplexer 703a is connected to the ground. The output terminal 703az of the multiplexer 703a is connected to a first input terminal (e.g., in1) of each of the first plurality of AND gate circuits 705a1, 705b1, 705c1, ..., 705m1.

However, if the comparator 701 determines that Vout is greater than Vdata, the second output 701b of the comparator 701, which is connected to the first input of the 2-to-1 multiplexer 703b, is turned on. The second input of the 2-to-1 multiplexer 703b is connected to the ground. The output terminal 703b2 of the multiplexer 703b is connected to a first input terminal (e.g., in1) of each of the second plurality of AND gate circuits 705a2, 705b2, 705c2, ..., 705m2. The selector pin or the start pin of the multiplexer 703b is connected to the selector pin or start pin of the multiplexer 703a.

The second output 701b of the comparator 701 is also connected to the pulse generator 702. The pulse generator receives the second output 701b of the comparator 701 via a delay circuit 709 at the first input terminal 702a1 of the pulse generator 702 and the pulse generator directly receives the second output 701b of the comparator 701 at the second input terminal 702a2 of the pulse generator 702. The pulse generator 702 generates a pulse at every output transition at the comparator 701 output (e.g., 701a, 701b). For example, the pulse generator 702 generates a pulse every time the comparator 701 output transitions from a positive voltage to a negative voltage or vice versa. The pulse generator 702 output is connected to the first input of the 2-to-1 multiplexer 703c. The second input of the 2-to-1 multiplexer 703c is connected to the ground. The output terminal 703cz of the multiplexer 703c is connected to the clock terminals of each of the individual shift registers 704a, 704b, 704c, 704d, ..., 704n of the n-bit shift register 704. Therefore, the n-bit shift register 704 is clocked by the pulse generator 702 output to turn on or turn off a desired number of pull-up transistor sets 707a1, 707b1, 707c1, ..., 707m1, or pull-down transistor sets 707a2, 707b2, 707c2, ..., 707m2, to take output voltage Vout at output 708 of the display driver 700 closer to the desired voltage value of Vdata.

A first output terminal (e.g., q) of each of the individual shift registers 704a, 704b, 704c, 704d, ..., 704n of the n-bit shift register 704 is connected to the input terminal (e.g., d) of the next shift register of the shift registers 704a, 704b, 704c, 704d, ..., 704n. For example, the first output terminal (e.g., q) of the shift register 704a is connected to the input terminal (e.g., d) of the next shift register 704b, the first output terminal (e.g., q) of the shift register 704b is connected to the input terminal (e.g., d) of the next shift register 704c, the first output terminal (e.g., q) of the shift register 704c is connected to the input terminal (e.g., d) of the next shift register 704d, or the like. The first output terminal (e.g., q) of the shift register 704a is also connected to the clock terminal of the shift register 706. The output terminal (e.g., q) of the shift register 706 is connected to the selector pin or start pin of the multiplexer 703c.

A second output terminal (e.g., qb) of each of the individual shift registers 704b, 704c, 704d, . . . , 704n of the n-bit shift register 704 is connected to the second input terminal (e.g., in2) of the corresponding ones of the first plurality of AND gate circuits 705a1, 705b1, 705c1, 705d1, 705e1, . . . , 705m1 and the second plurality of AND gate circuits 705a2, 705b2, 705c2, . . . , 705m2. For example, the second output terminal (e.g., qb) of the shift register 704b is connected to the second input terminals (e.g., in2) of the AND gate circuits 705a1 and 705a2, the second output terminal (e.g., qb) of the shift register 704c is connected to the second input terminals (e.g., in2) of the AND gate circuits 705b1 and 705b2, the second output terminal (e.g., qb) of the shift register 704d is connected to the second input terminals (e.g., in2) of the AND gate circuits 705c1 and 705c2, and the second output terminal (e.g., qb) of the shift register 704n is connected to the second input terminals (e.g., in2) of the AND gate circuits 705m1 and 705m2.

Figure 8:
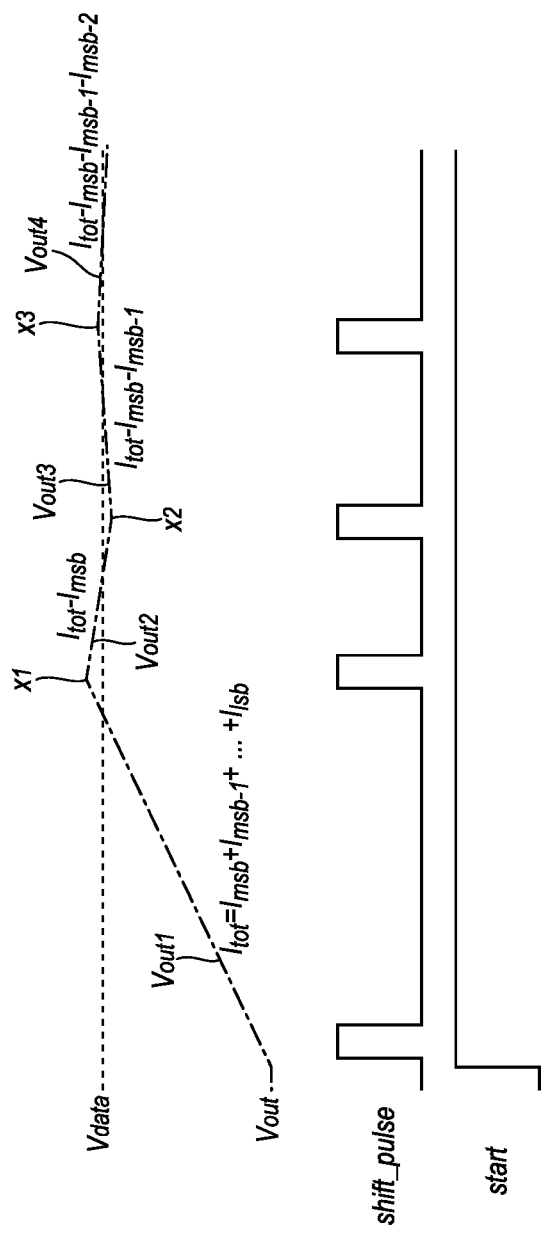
FIG. 8 illustrates an example timing diagram of the display driver circuit of FIG. 7 according to some embodiments of the present disclosure.

FIG. 8 illustrates an example timing diagram of the display driver circuit 700 of FIG. 7. When the display driver 700 starts, for example, at the beginning of the start pulse, all the n-sets of pull-up transistors 707a1, 707b1, 707c1, . . . , 707m1 turns on, and therefore creating the first positive slope Vout1 of output voltage Vout at the output terminal 708. Start signal triggers start of column driving. A shift pulse is generated (e.g., from the pulse generator 702) when the display driver 700 starts or at the beginning of the start pulse. As all the pull-up current legs 707a1, 707b1, 707c1, . . . , 707m1 are turned on, the output voltage Vout may overshoot to go above Vdata. At this point, the current at the output may be Itot=(Imsb+Imsb-1+Imsb-2+ . . . +Ilsb). Start current Itot is the sum of the currents in all pull-up current legs 707a1, 707b1, 707c1, . . . , 707m1.

Once the Vout overshoots the Vdata at x1, the comparator 701 compares the voltage Vout at the output 708 of the display driver 700 with the reference voltage Vdata, and due to the overshoot, the comparator 701 determines that Vout is greater than Vdata. Based on the compared voltage at the comparator 701, a certain plurality of pull down current legs from the pull-down current legs of 707a2, 707b2, 707c2, . . . , 707m2 are turned on, which may result in pulling down the Vout, and therefore creating the first negative slope Vout2 of the output voltage Vout. As such, as start signal propagates through the shift registers 704a, 704b, 704c, 704d, . . . , 704n, pull-up (e.g., pull-up current legs 707a1, 707b1, 707c1, . . . , 707m1) or pull-down (e.g., 707a2, 707b2, 707c2, . . . , 707m2) current legs are successively turned off. At any given instant, only one of the two sets of current legs (e.g., pull-up current legs (707a1, 707b1, 707c1, . . . , 707m1) or pull-down current legs (e.g., 707a2, 707b2, 707c2, . . . , 707m2)) is on. Final error (e.g., after point x3, during Vout4) or the difference between Vdata and Vout is a function of smallest current leg (e.g., 707m1 or 707m2 with current $I_{lsb}$)) and the comparator 701 delay. At x1, x2, or x3, as the output voltage Vout transitions from having a positive slope (during Vout1) to negatives slope or vice versa, shift pulse is generated (e.g., from the pulse generator 702). In some example embodiments, a shift pulse is generated at every output transition at the comparator 701 output (e.g., 701a, 701b).

Figure 9:
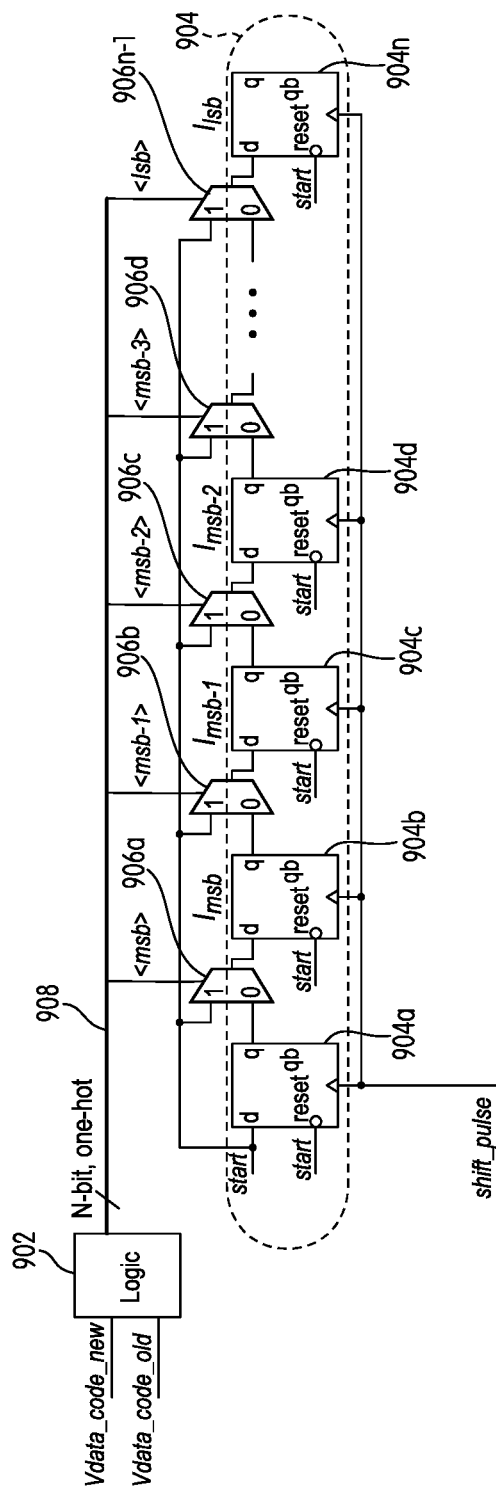
FIG. 9 illustrates an example circuit incorporating a logic circuit and an N-bit shift register according to some embodiments of the present disclosure.

FIG. 9 illustrates an example circuit 900 incorporating a logic circuit 902 and an N-bit shift register 904. In some example embodiments, the n-bit shift register 704 of FIG. 7 may be replaced with the n-bit shift register 904 of FIG. 9 and the shift register 706 of FIG. 7 may be replaced with the logic 902 of FIG. 9. The N-bit shift register 904 includes "n" individual shift registers 904a, 904b, 904c, 904d, . . . , 904n. The n-bit shift register 904 is clocked by a shift pulse generated from a pulse generator (e.g., 702). A first output terminal (e.g., q) of each of the "n" individual shift registers 904a, 904b, 904c, 904d, . . . , 904n of the n-bit shift register 904 is connected to the input terminal (e.g., d) of the next shift register of the shift registers 904a, 904b, 904c, 904d, . . . , 904n via a multiplexer of a plurality of (n–1) multiplexers 906a, 906b, 906c, 906d, . . . , 906 (n–1). For example, the first output terminal (e.g., q) of the shift register 904a is connected to a first input terminal of the multiplexer 906a and the output terminal of the multiplexer 906a is connected to the input terminal (e.g., d) of the next shift register 904b, the first output terminal (e.g., q) of the shift register 904b is connected to a first input terminal of the multiplexer 906b and the output terminal of the multiplexer 906b is connected to the input terminal (e.g., d) of the next shift register 904c, the first output terminal (e.g., q) of the shift register 904c is connected to a first input terminal of the multiplexer 906c and the output terminal of the multiplexer 906c is connected to the input terminal (e.g., d) of the next shift register 904d, or the like. The second input terminals of each of the (n–1) multiplexers 906a, 906b, 906c, 906d, . . . , 906 (n–1) are connected to each other and to the input terminal (e.g., d) of the shift register 904a.

Digital logic 902 is used to determine the magnitude of difference between a new and an old pixel gray levels, as a smaller difference in pixel gray levels may allow for increased charging time and therefore a smaller start current for the display driver (e.g., 700). The new gray level is the same value that would go to a traditional driver. It comes from a controller (not shown in any figure). The "old" value could simply be a register (not shown) that stores this value for the next write operation. An N-bit one-hot control bus 908 is used to inject start signal at the required shift register (e.g., 904a, 904b, 904c, 904d, . . . , 904n) location. The example circuit 900 of the shift register 904 with the logic 902 lowers the initial current spike when approximately 2000 column-line drivers turn on. Moreover, the one-hot control bus 908 may also be configured based on display-type to use a lower Itot, for example, increased line time may allow greater charging time and therefore a smaller start current Itot.

The example embodiment of the display driver (e.g., 700) with shift registers (e.g., 704, 904) of the present disclosure may provide high efficiency compared to the column drivers currently available to the market, as in the example display driver 700 all of the current drawn goes towards charging display column line. Moreover, the example embodiment of the display driver 700 may reduce current spike caused by driver-IC by using current sources instead of class-B or class-AB amplifier. Different example embodiments of the column driver or display driver (e.g., 700) of the present disclosure may use programmable start-signal injection (e.g., from logic 902 using N-bit, one hot bus 908 in FIG. 9) to lower this current spike further based on 1) magnitude of difference between new and old pixel gray-level setting, as a smaller difference in pixel gray level may allow for increased charging time and therefore a smaller start current for the display driver (e.g., 700) and 2) refresh rate (e.g., horizontal line time), as increased line time may allow greater charging time and therefore a smaller start current Itot, as discussed with respect to circuit 900 of FIG. 9.

In some example embodiments, for lower resolution displays (e.g., where larger error between Vdata and Vout is tolerated), current may be further optimized using the example column driver or display driver (e.g., 700) of the present disclosure by disabling (e.g., permanently disabling) multiple current legs, for example, pull-up current legs (707a1, 707b1, 707c1, . . . , 707m1) or pull-down current legs (e.g., 707a2, 707b2, 707c2, . . . , 707m2) of the column driver or the display driver (e.g., 700). In some example embodiments of the column driver or the display driver (e.g., 700) of the present disclosure, current-DAC (e.g., 32 of FIG. 2) may be reused for current sensing for per-pixel calibration.

The display driver 700 of FIG. 7 may be a piece-wise linear current-mode display driver where the line charging current is adjusted adaptively based on the voltage level (e.g., Vout) at the output 708 of the driver 700. In the display driver 700, the pull-up and pull-down current sources (e.g., pull-up current legs (707a1, 707b1, 707c1, . . . , 707m1) or pull-down current legs (e.g., 707a2, 707b2, 707c2, . . . , 707m2)) are segmented and current adjustment is done when segments (e.g., pull-up current legs (707a1, 707b1, 707c1, . . . , 707m1) or pull-down current legs (e.g., 707a2, 707b2, 707c2, . . . , 707m2)) are enabled and disabled as the output voltage Vout converges towards the desired level Vdata. Also, in the display driver 700, the disabling and enabling of the segments (e.g., pull-up current legs (707a1, 707b1, 707c1, . . . , 707m1) or pull-down current legs (e.g., 707a2, 707b2, 707c2, . . . , 707m2)) is done with a shift-register (e.g. 704) asynchronously shifting a one-hot enable code (e.g., as shown in circuit 900 of FIG. 9) for the segmented current sources (e.g., pull-up current legs (707a1, 707b1, 707c1, . . . , 707m1) or pull-down current legs (e.g., 707a2, 707b2, 707c2, . . . , 707m2)) as the driver output voltage Vout crosses the target voltage level Vdata (e.g., as discussed with respect to FIG. 8). Moreover, in the display driver 700, the initial setting of the one-hot code (e.g., at bus 908 as discussed with respect to FIG. 9) is a function of the existing level of output voltage Vout) and the target output voltage Vdata.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of" when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Although exemplary embodiments of a system and a method for a high-efficiency piecewise linear column driver with asynchronous control for displays have been specifically described and illustrated herein, many modifications and variations will be apparent to those skilled in the art. Accordingly, it is to be understood that to a system and a method for a high-efficiency piecewise linear column driver with asynchronous control for displays constructed according to principles of this invention may be embodied other than as specifically described herein. The invention is also defined in the following claims, and equivalents thereof.

What is claimed is:

1. A device comprising:
   a segmented pull-up current source circuit configured to supply a pull-up current to a load connected to an output of the device, wherein the segmented pull-up current source circuit comprising a first plurality of transistors comprising m-sets of transistors;
   a segmented pull-down current source circuit configured to supply a pull-down current to the load connected to the output of the device, wherein the segmented pull-down current source circuit comprising a second plurality of transistors comprising m-sets of transistors, wherein the segmented pull-up current source circuit and the segmented pull-down current source circuit are connected to each other via a first plurality of AND gate circuits and a second plurality of AND gate circuits;
   a comparator circuit configured to compare an output voltage level at the output of the device with a target voltage level and generate a comparator output at one of two output terminals of the comparator circuit, wherein the segmented pull-up current source circuit and the segmented pull-down current source circuit are connected to the two output terminals of the comparator circuit via one or more multiplexers, the first plurality of AND gate circuits and a second plurality of AND gate circuits; and
   a logic circuit connected to at least one output terminal of the comparator circuit and configured to control an operation of the segmented pull-up current source circuit and the segmented pull-down current source circuit based on the comparator output,
   wherein the logic circuit is a n-bit shift register comprising "n" individual shift registers, wherein "n" is a positive integer, and wherein each individual shift register of the "n" individual shift registers is configured to control a corresponding set of transistors of the m-sets of transistors of the first plurality of transistors based on the comparator output.

2. The device of claim 1, wherein the device is a column driver for an organic light emitting diode (OLED) display and wherein the load connected to the output of the device is an OLED.

3. The device of claim 1, wherein "m" is a positive integer, wherein each set of transistors of the m-sets of transistors of the first plurality of transistors comprises a p-type metal-oxide-semiconductor field-effect transistor (MOSFET) and an n-type MOSFET connected in series with each other, and wherein each set of transistors of the m-sets of transistors of the second plurality of transistors comprises two n-type MOSFETs connected in series with each other.

4. The device of claim 3, wherein in each set of transistors of the m-sets of transistors of the first plurality of transistors, a source terminal of the p-type MOSFET is connected to VDD, a drain terminal of the p-type MOSFET is connected to a drain terminal of the n-type MOSFET, and a gate terminal of the p-type MOSFET is connected to a bias voltage Vbiasp.

5. The device of claim 4, wherein in the m-sets of transistors of the first plurality of transistors, source terminals of the n-type MOSFETs are connected with each other and to the output of the device, and gate terminals of the n-type MOSFETs are connected to output terminals of corresponding ones of the first plurality of AND gate circuits comprising "m" individual AND gate circuits.

6. The device of claim 3, wherein in the m-sets of transistors of the second plurality of transistors, drain terminals of first n-type MOSFETs are connected with each other and to the output of the device, and wherein gate terminals of the first n-type MOSFETs are connected to output terminals of corresponding ones of the second plurality of AND gate circuits comprising "m" individual AND gate circuits.

7. The device of claim 6, wherein in each set of transistors of the m-sets of transistors of the second plurality of transistors, a source terminal of the first n-type MOSFET is connected to a drain terminal of a second n-type MOSFET, a source terminal of the second n-type MOSFET is connected to ground and a gate terminal of the second n-type MOSFET is connected to a bias voltage Vbiasn.

8. The device of claim 1, wherein the comparator circuit is an operational amplifier (op-amp).

9. The device of claim 1, wherein a first output terminal of each of the "n" individual shift registers is connected to an input terminal of the next shift register of the "n" individual shift registers via a multiplexer of a plurality of (n−1) multiplexers of the one or more multiplexers.

10. The device of claim 9, wherein a digital logic is used to determine a magnitude of difference between a new and an old pixel gray levels.

11. The device of claim 1, the logic circuit is connected to the at least one output terminal of the comparator circuit via a pulse generator configured to generate a pulse at every transition of the comparator output, wherein the pulse generator is an exclusive-OR gate circuit.

12. A device comprising:
   a segmented pull-up current source circuit configured to supply a pull-up current to a load connected to an output of the device, wherein the segmented pull-up current source circuit comprising a first plurality of transistors comprising m-sets of transistors;
   a segmented pull-down current source circuit configured to supply a pull-down current to the load connected to the output of the device;

a comparator circuit configured to compare an output voltage level at the output of the device with a target voltage level and generate a comparator output at one of two output terminals of the comparator circuit; and a logic circuit connected to at least one output terminal of the comparator circuit and configured to control an operation of the segmented pull-up current source circuit and the segmented pull-down current source circuit based on the comparator output, wherein the logic circuit is a n-bit shift register comprising "n" individual shift registers, wherein "n" is a positive integer, and wherein each individual shift register of the "n" individual shift registers is configured to control a corresponding set of transistors of the m-sets of transistors of the first plurality of transistors based on the comparator output.

13. The device of claim 12, wherein:

wherein each set of transistors of the m-sets of transistors of the first plurality of transistors comprises a p-type metal-oxide-semiconductor field-effect transistor (MOSFET) and an n-type MOSFET connected in series with each other;

the segmented pull-down current source circuit comprising a second plurality of transistors comprising m-sets of transistors, wherein each set of transistors of the m-sets of transistors of the second plurality of transistors comprises two n-type MOSFETs connected in series with each other, wherein the segmented pull-up current source circuit and the segmented pull-down current source circuit are connected to each other via a first plurality of AND gate circuits and a second plurality of AND gate circuits; and the segmented pull-up current source circuit and the segmented pull-down current source circuit are connected to the two output terminals of the comparator circuit via one or more multiplexers, the first plurality of AND gate circuits and a second plurality of AND gate circuits.

14. The device of claim 13, wherein the device is a column driver for an organic light emitting diode (OLED) display, wherein the load connected to the output of the device is an OLED.

15. The device of claim 13, wherein in each set of transistors of the m-sets of transistors of the first plurality of transistors, a source terminal of the p-type MOSFET is connected to VDD, a drain terminal of the p-type MOSFET is connected to a drain terminal of the n-type MOSFET, and a gate terminal of the p-type MOSFET is connected to a bias voltage Vbiasp.

16. The device of claim 15, wherein in the m-sets of transistors of the first plurality of transistors, source terminals of the n-type MOSFETs are connected with each other and to the output of the device, and gate terminals of the n-type MOSFETs are connected to output terminals of corresponding ones of the first plurality of AND gate circuits comprising "m" individual AND gate circuits.

17. The device of claim 13, wherein in the m-sets of transistors of the second plurality of transistors, drain terminals of first n-type MOSFETs are connected with each other and to the output of the device, wherein gate terminals of the first n-type MOSFETs are connected to output terminals of corresponding ones of the second plurality of AND gate circuits comprising "m" individual AND gate circuits, and wherein in each set of transistors of the m-sets of transistors of the second plurality of transistors, a source terminal of the first n-type MOSFET is connected to a drain terminal of a second n-type MOSFET, a source terminal of the second n-type MOSFET is connected to ground and a gate terminal of the second n-type MOSFET is connected to a bias voltage Vbiasn.

18. The device of claim 13, wherein a first output terminal of each of the "n" individual shift registers is connected to an input terminal of the next shift register of the "n" individual shift registers via a multiplexer of a plurality of (n−1) multiplexers of the one or more multiplexers, wherein a digital logic is used to determine a magnitude of difference between a new and an old pixel gray levels, and wherein "m" and "n" are positive integers.

19. A method of driving a display driver comprising:

a segmented pull-up current source circuit configured to supply a pull-up current to a load connected to an output of the display driver, wherein the segmented pull-up current source circuit comprising a first plurality of transistors comprising m-sets of transistors;

a segmented pull-down current source circuit configured to supply a pull-down current to the load connected to the output of the display driver, wherein the segmented pull-down current source circuit comprising a second plurality of transistors comprising m-sets of transistors, wherein the segmented pull-up current source circuit and the segmented pull-down current source circuit are connected to each other via a first plurality of AND gate circuits and a second plurality of AND gate circuits;

a comparator circuit configured to compare an output voltage level at the output of the display driver with a target voltage level and generate a comparator output at one of two output terminals of the comparator circuit, wherein the segmented pull-up current source circuit and the segmented pull-down current source circuit are connected to the two output terminals of the comparator circuit via one or more multiplexers, the first plurality of AND gate circuits and a second plurality of AND gate circuits; and a logic circuit connected to at least one output terminal of the comparator circuit and configured to control an operation of the segmented pull-up current source circuit and the segmented pull-down current source circuit based on the comparator output, wherein the logic circuit is a n-bit shift register comprising "n" individual shift registers, wherein "n" is a positive integer, and wherein each individual shift register of the "n" individual shift registers is configured to control a corresponding set of transistors of the m-sets of transistors of the first plurality of transistors based on the comparator output; the method comprising:

turning on the first plurality of transistors comprising m-sets of transistors based on receiving a start pulse from a pulse generator at an input terminal of the logic circuit;

comparing at the comparator the output voltage level at the output of the display driver with the target voltage level to generate the comparator output; and turning on or turning off one or more of the first plurality of transistors or the second plurality of transistors based on the comparator output.

20. The method of claim 19, wherein each set of transistors of the m-sets of transistors of the first plurality of transistors comprises a p-type metal-oxide-semiconductor field-effect transistor (MOSFET) and an n-type MOSFET connected in series with each other, and wherein each set of transistors of the m-sets of transistors of the second plurality of transistors comprises two n-type MOSFETs connected in series with each other.

* * * * *